United States Patent
Misawa et al.

(10) Patent No.: US 11,830,658 B2
(45) Date of Patent: Nov. 28, 2023

(54) METHOD FOR MANUFACTURING COIL COMPONENT WITH MAGNETIC BASE BODY FORMED USING METAL MAGNETIC GRAINS AND RESINATE

(71) Applicant: TAIYO YUDEN CO., LTD., Tokyo (JP)

(72) Inventors: Kazuki Misawa, Takasaki (JP); Kinshiro Takadate, Takasaki (JP); Shinsuke Takeoka, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/972,441

(22) Filed: Oct. 24, 2022

(65) Prior Publication Data

US 2023/0068049 A1 Mar. 2, 2023

Related U.S. Application Data

(62) Division of application No. 17/151,063, filed on Jan. 15, 2021, now Pat. No. 11,515,074.

(30) Foreign Application Priority Data

Feb. 18, 2020 (JP) .................................. 2020-025658

(51) Int. Cl.
*H01F 27/28* (2006.01)
*H05K 1/18* (2006.01)
(Continued)

(52) U.S. Cl.
CPC ......... *H01F 27/2823* (2013.01); *H01F 27/24* (2013.01); *H01F 41/0246* (2013.01);
(Continued)

(58) Field of Classification Search
CPC .................................................. H01F 27/2823
(Continued)

(56) References Cited

U.S. PATENT DOCUMENTS

2006/0008706 A1* 1/2006 Yamaguchi ........... H01M 4/134
429/313
2015/0099115 A1 4/2015 Maeda et al.
(Continued)

FOREIGN PATENT DOCUMENTS

| JP | 2014143301 A | 8/2014 |
|---|---|---|
| JP | 2019153614 A | 9/2019 |
| WO | 2014024976 A1 | 2/2014 |

OTHER PUBLICATIONS

Final Office Action issued by U.S. Patent and Trademark Office, dated Dec. 1, 2021, for related U.S. Appl. No. 17/151,063 (11 pages).

(Continued)

*Primary Examiner* — Stanley Tso
(74) *Attorney, Agent, or Firm* — Law Office of Katsuhiro Arai

(57) ABSTRACT

A method for manufacturing a coil component includes: providing multiple metal magnetic grains; preparing a magnetic body paste by mixing the multiple metal magnetic grains, a binder resin containing a resinate having at least one element selected from the group consisting of Si, Al, Cr, Mg, Ti, and Zr, and a solvent; forming a compact using the magnetic body paste; heat-treating the compact to form, on surfaces of the metal magnetic grains, bonding parts constituted by an amorphous oxide containing carbon and the at least one element, thereby forming a magnetic base body wherein the multiple metal magnetic grains are bonded via the bonding parts; forming a coil that includes a metal conductor; and forming external electrodes on surfaces of (Continued)

the magnetic base body and connecting end parts of the coil to the external electrodes, respectively.

20 Claims, 6 Drawing Sheets

(51) Int. Cl.
  *H01F 41/02* (2006.01)
  *H01F 41/06* (2016.01)
  *H01F 27/24* (2006.01)
(52) U.S. Cl.
  CPC ............ *H01F 41/06* (2013.01); *H05K 1/181* (2013.01); *H05K 2201/1003* (2013.01)
(58) Field of Classification Search
  USPC ........................................ 174/260
  See application file for complete search history.

(56) References Cited

U.S. PATENT DOCUMENTS

| | | |
|---|---|---|
| 2015/0371745 A1* | 12/2015 | Araki .................. B22F 1/102 427/127 |
| 2015/0371754 A1 | 12/2015 | Im et al. |
| 2018/0005739 A1* | 1/2018 | Orimo .................. C01B 33/12 |
| 2018/0226677 A1 | 8/2018 | Nishiura et al. |
| 2020/0274147 A1 | 8/2020 | Lee et al. |

OTHER PUBLICATIONS

Non-Final Office Action issued by U.S. Patent and Trademark Office, dated Aug. 23, 2021, for related U.S. Appl. No. 17/151,063 (14 pages).

Notice of Allowance issued by U.S. Patent and Trademark Office, dated Aug. 3, 2022, for related U.S. Appl. No. 17/151,063 (9 pages).

A Notice of Reasons for Refusal issued by the Japanese Patent Office, dated Sep. 5, 2023, for Japanese related application No. 2020-025658. (3 pages).

\* cited by examiner

METHOD FOR MANUFACTURING COIL COMPONENT WITH MAGNETIC BASE BODY FORMED USING METAL MAGNETIC GRAINS AND RESINATE

CROSS-REFERENCE TO RELATED APPLICATIONS

This application is a divisional of U.S. patent application Ser. No. 17/151,063, filed Jan. 15, 2021, which claims priority to Japanese Patent Application No. 2020-025658, filed Feb. 18, 2020, each disclosure of which is incorporated herein by reference in its entirety. The applicant herein explicitly rescinds and retracts any prior disclaimers or disavowals or any amendment/statement otherwise limiting claim scope made in any parent, child or related prosecution history with regard to any subject matter supported by the present application.

BACKGROUND

Field of the Invention

The present invention relates to a magnetic base body, a coil component, and an electronic device.

Description of the Related Art

Coil components that use metal magnetic grains offering excellent direct-current superimposition property, instead of ferrite, have been proposed. Since metal magnetic grains are low in insulating property, an art of coating the surface of metal magnetic grains with silicon oxide films, aluminum oxide films, or other insulating films is known. For example, magnetic base bodies, each comprising metal magnetic grains coated with an insulating film, and a glass component containing silicon, boron, and alkali metal, are known (refer to Patent Literature 1, for example). Also, magnetic base bodies, each comprising metal magnetic grains coated with an insulating film, and a silicone resin, are known (refer to Patent Literature 2, for example).

Background Art Literatures

[Patent Literature 1] International Patent Laid-open No. 2014/024976
[Patent Literature 2] Japanese Patent Laid-open No. 2019-153614

SUMMARY

It is desired that, to improve the reliability of coil components, their magnetic base bodies have high insulation reliability and mechanical strength. Also, conceivably, magnetic base bodies can be formed by bonding together the oxide films on multiple metal magnetic grains whose surface has been covered with an oxide film, in order to increase the filling rate of metal magnetic grains and thereby achieve better magnetic properties, for example. In this case, heat treatment at high temperature is needed to bond together the oxide films on metal magnetic grains. For example, heat treatment is performed at high temperature in Patent Literature 2. When subjected to heat treatment at high temperature, however, the metal magnetic grains will bond directly over the oxides (necking). This makes it difficult to administer heat treatment at high temperature in a manner preventing the metal magnetic grains from sintering, which consequently makes it difficult to obtain a magnetic base body having high mechanical strength.

The present invention was made in light of the aforementioned problems, and its object is to improve the mechanical strength while ensuring insulation reliability.

The present invention is a magnetic base body comprising multiple metal magnetic grains and bonding parts for bonding the multiple metal magnetic grains, wherein the bonding parts are constituted by an amorphous mixture containing carbon and an oxide of at least one element selected from silicon, aluminum, chromium, magnesium, titanium, and zirconium.

The aforementioned constitution may be a constitution where, when the total quantity by mol of silicon, aluminum, chromium, magnesium, titanium, and zirconium contained in the bonding parts is 1, the ratio by mol of carbon in the bonding parts is 5 or lower.

The aforementioned constitution may be a constitution where, when the total quantity by mol of silicon, aluminum, chromium, magnesium, titanium, and zirconium contained in the bonding parts is 1, the ratio by mol of carbon in the bonding parts is 0.4 or higher.

The aforementioned constitution may be a constitution where there are oxide films covering the surface of the multiple metal magnetic grains at least partially and containing substantially no carbon in the film, and the bonding parts bond the multiple metal magnetic grains as a result of their oxide films bonding together via the bonding parts.

The aforementioned constitution may be a constitution where the amorphous mixture constituting the bonding parts contains an oxide of silicon as its primary component.

The aforementioned constitution may be a constitution where the primary component of the multiple metal magnetic grains is iron.

The present invention is a coil component comprising the aforementioned magnetic base body and a coil conductor provided in the magnetic base body.

The present invention is an electronic device comprising the aforementioned coil component and a circuit board on which the coil component is mounted.

According to the present invention, mechanical strength can be improved while ensuring insulation reliability.

DESCRIPTION OF THE SYMBOLS

Figure 1:
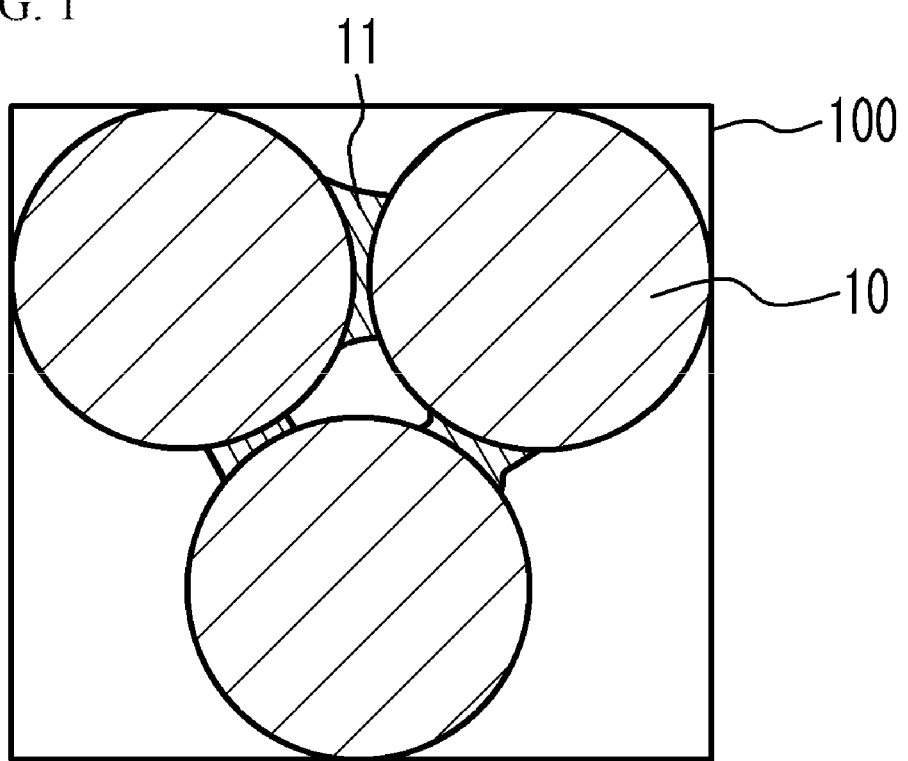
FIG. 1 is a cross-sectional view showing the magnetic base body pertaining to the first embodiment of the invention under the present application for patent.

10 Metal magnetic grain
11 Bonding part

12 Oxide film
20, 26 Cover layer
21 to 25 Magnetic layer
30 Coil conductor
31 to 35 Conductor pattern
50 to 53 External electrode
60 Winding core part
61, 62 Flange part
70 Coil winding part
71 Coated conductive wire
80 Circuit board
81 Electrode
82 Solder
100, 200 Magnetic base body
300, 400 Coil component
500 Electronic device

DETAILED DESCRIPTION OF EMBODIMENTS

Embodiments of the invention under the present application for patent are explained below by referring to the drawings as deemed appropriate. It should be noted that the invention under the present application for patent is not limited to the illustrated modes. Also, constitutional elements common to multiple drawings are denoted using the same reference symbols throughout the multiple drawings. Attention is drawn to the fact that, for the purpose of illustration, each drawing is not necessarily to scale.

First Embodiment

FIG. 1 is a cross-sectional view showing the magnetic base body pertaining to the first embodiment of the invention under the present application for patent. In FIG. 1, a part of the magnetic base body 100 pertaining to the first embodiment is enlarged for illustration. With reference to FIG. 1, multiple metal magnetic grains 10 are bonded via bonding parts 11 having insulating property, and consequently the magnetic base body 100 having insulating property is formed. Presence of the bonding parts 11 can be recognized as differences in contrast (brightness) in an image of a cross-section of the magnetic base body 100 captured with a scanning electron microscope (SEM) at a magnification of 5000 or so, for example.

The metal magnetic grains 10 are soft magnetic grains whose primary component is iron, for example, which may be alloy grains or pure iron grains. By "primary component is iron," it means the percentage of iron to the total quantity of the elements constituting the metal magnetic grain 10 is 50 percent by weight or higher, where it may be 80 percent by weight or higher, or 90 percent by weight or higher, or 95 percent by weight or higher. If the metal magnetic grains 10 are pure iron grains, for example, the percentage of iron may be 98 percent by weight or higher, with impurities, etc., accounting for the remainder. For example, the metal magnetic grains 10 may be alloy grains containing iron and silicon, or alloy grains containing iron and at least one type of metal element M whose ionization tendency is greater than that of iron (which oxidizes more easily than iron). Examples of metal element M include chromium (Cr), aluminum (Al), zirconium (Zr), titanium (Ti), manganese (Mn), and the like. As an example, the metal magnetic grains 10 may be alloy grains of iron, silicon, and at least one type of metal element M whose ionization tendency is greater than that of iron (such as at least one of chromium and aluminum). The percentage of iron may be 93 to 98 percent by weight, percentage of silicon may be 1.5 to 6.5 percent by weight, and percentage of metal element M may be 0.5 to 5.5 percent by weight. The metal magnetic grains 10 may contain unintended impurities such as oxygen and/or carbon. The percentage of impurities may be 2 percent by weight or lower. Also, the metal magnetic grains 10 may contain cobalt (Co), nickel (Ni), copper (Cu), sulfur (S), phosphorus (P), and/or boron (B), and the like. The composition ratios of the metal magnetic grain 10 can be calculated by capturing a cross-section of the magnetic base body 100 with a scanning electron microscope at a magnification of 3000 to 20000 or so, for example, and then applying the ZAF method based on energy dispersive X-ray spectroscopy (EDS) to the results.

The average grain size of the multiple metal magnetic grains 10 is 1 μm or greater but no greater than 10 μm, for example. The average grain size of the metal magnetic grains 10 is a grain size corresponding to 50 percent of the granularity distribution obtained based on an image of a cross-section of the magnetic base body 100 captured with a scanning electron microscope at a magnification of 2000 to 5000 or so. When the average grain size is adjusted to no greater than 10 μm, eddy-current loss in the metal magnetic grains 10 can be inhibited. When the average grain size is adjusted to 1 μm or greater, spontaneous combustion that could otherwise be caused by the metal magnetic grains 10 oxidizing spontaneously in the air can be inhibited, resulting in greater ease of handling.

The magnetic base body 100 may contain two or more types of metal magnetic grains 10 having different average grain sizes. For example, it may contain a first metal magnetic grain group and a second metal magnetic grain group, respectively having different average grain sizes. The average grain size of the second metal magnetic grain group may be one-half the average grain size of the first metal magnetic grain group or smaller. When the average grain size of the second metal magnetic grain group is smaller than the average grain size of the first metal magnetic grain group, the second metal magnetic grains can easily enter the gaps between the adjacent first metal magnetic grains, which increases the filling rate of metal magnetic grains. Furthermore, a third metal magnetic grain group whose average grain size is smaller than that of the second metal magnetic grain group may be contained.

The magnetic base body 100 may contain two or more types of metal magnetic grains 10 having different compositions. For example, it may contain FeSiCr alloy grains in which the ratio of Si has been increased to reduce magnetostriction and thereby improve magnetic permeability, and FeSiCr alloy grains in which the ratio of Fe has been increased to improve saturated magnetic flux density. This way, the magnetic base body 100 having desired magnetic properties can be obtained.

The bonding parts 11 are formed with a resinate comprising at least one element selected from silicon (Si), aluminum (Al), chromium (Cr), magnesium (Mg), titanium (Ti), and zirconium (Zr), as described in "Manufacturing Method" below. This means that the bonding parts 11 represent an amorphous mixture containing carbon (C) and an oxide of at least one element selected from Si, Al, Cr, Mg, Ti, and Zr. The bonding parts 11 are such that carbon may be dispersed uniformly in the bonding part 11, or there may be locations where carbon is concentrated. Preferably carbon is distributed throughout the bonding part 11, where it is distributed preferably over an area corresponding to at least 80 percent, or more preferably over an area corresponding to at least 90 percent, of the bonding part 11. The composition of the bonding parts 11 can be confirmed by capturing a cross-section of the magnetic base body 100 with a scanning electron microscope at a magnification of 3000 to 20000 or so, for example, and then applying the ZAF method based on energy dispersive X-ray spectroscopy (EDS) to the results.

[Manufacturing Method]

An example of how the magnetic base body pertaining to the first embodiment is manufactured, is explained. First, multiple metal magnetic grains are mixed with a resin composition and a solvent, to prepare a magnetic body paste. Here, the resin composition contains a binder resin, and a resinate that dissolves in the binder resin and comprises at least one element selected from Si, Al, Cr, Mg, Ti, and Zr. For the resinate, if it comprises Si, for example, a silsesquioxane having the $(R—SiO_{1.5})_n$ structure (R: organic functional group), siloxane having the Si—O—Si structure, compound having other Si—O skeleton (Si—O structure), or a mixture thereof, may be used. Additionally, an alkoxide having the M-OR structure (M: Si, Al, Cr, Mg, Ti, and/or Zr, R: organic functional group) may also be used as the resinate. The resinate, being dissolved in the binder resin, exists not as a filler or other solid phase, but as a half-solid phase or liquid phase including sol-gel state, in the binder resin. Being dissolved in the binder resin, the resinate cannot be separated from the binder resin using any general mesh (sieve).

For the solvent, any material that can dissolve the resinate may be used. For example, toluene may be used as the solvent. For the binder resin, any resin that dissolves in the solvent may be used. The binder resin may be a thermosetting resin offering excellent insulating property. For example, an epoxy resin, phenol resin, polyimide resin, silicone resin, polystyrene (PS) resin, high-density polyethylene (HDPE) resin, polyoxymethylene (POM) resin, polycarbonate (PC) resin, polyvinylidene fluoride (PVDF) resin, polytetrafluoroethylene (PTFE) resin, polybenzoxazole (PBO) resin, polyvinyl alcohol (PVA) resin, polyvinyl butyral (PVB) resin, acrylic resin, or mixture thereof, may be used as the binder resin. The binder resin and resinate, being dissolved in the solvent, may each exist independently, or they may exist in a physically-bonded state and/or chemically-bonded state, in the solvent.

The prepared magnetic body paste is applied on a polyethylene terephthalate (PET) film or other film using the doctor blade method or the like, for example, and dried with a hot-air dryer or other dryer. Thereafter, the film is peeled and removed to form a magnetic layer. Next, multiple such magnetic layers are stacked and pressure-bonded. The pressure-bonded magnetic layers are then cut to individual chips using a dicing machine, laser processing machine, etc., to obtain chip laminates. If necessary, the end parts of the chip laminates may be barreled or otherwise polished.

Next, the chip laminates are heat-treated. Performing heat treatment in atmosphere where a lot of oxygen is supplied facilitates excessive oxidation of the metal magnetic grains that contain iron at a high ratio. This is why, instead of the conventional approach of heat-treating the chip laminates in atmosphere when the composition ratio of iron is 92.5 percent by weight or lower, the invention under the present application for patent employs heat treatment performed for 20 to 120 minutes at 500° C. or higher (such as between 600 and 900° C.) in an ambience of 2 to 10000 ppm in oxygen concentration, for example. While the heat treatment at 500° C. or higher causes the binder resin to be thermally decomposed and thus removed in the process of raising the temperature to 500° C., the resinate, which has a stronger structure than the binder resin, is hardly removed in the process of raising the temperature to 500° C. and only starts to decompose and amorphize gradually once the treatment temperature reaches 500° C. and beyond. By adjusting the applicable oxygen concentration to between 2 and 10000 ppm, oxidation decomposition of the carbon constituting the resinate is inhibited. As a result, the carbon is taken up by the amorphous. In other words, decomposition of the binder resin is followed by amorphization of the metal component (at least one element selected from Si, Al, Cr, Mg, Ti, and Zr) constituting the resinate, and in this process the carbon is taken up by parts of the amorphous. Accordingly, bonding parts 11, constituted by an amorphous oxide containing carbon and at least one element selected from Si, Al, Cr, Mg, Ti, and Zr, are formed on the surface of the metal magnetic grains 10 and, as multiple metal magnetic grains 10 are bonded via the bonding parts 11, a magnetic base body 100 is formed. Degreasing may be performed in the process of raising the temperature during the heat treatment, as described in this example, or an exclusive heat treatment for degreasing may be performed separately.

Since the resinate comprising at least one element selected from Si, Al, Cr, Mg, Ti, and Zr can be better dispersed when combined with the binder resin, the use quantity of the resinate can be decreased. This means that the percentage of the magnetic base body 100 occupied by the bonding parts 11 can be decreased, and consequently the percentage occupied by the metal magnetic grains 10, or filling rate, can be increased. As a result, lowering of magnetic permeability can be inhibited. Also, good dispersibility means greater ease of manufacturing of the magnetic base body 100. It should be noted that, in the magnetic base body 100, resinate-derived carbon may be present other than in the bonding parts 11; for example, carbon may be present at triple-point parts surrounded by three or more metal magnetic grains 10.

According to the first embodiment, the multiple metal magnetic grains 10 are bonded by the bonding parts 11 constituted by an amorphous mixture containing carbon and an oxide of at least one element selected from Si, Al, Cr, Mg, Ti, and Zr. Because the bonding parts 11 constituted by the amorphous mixture contain carbon, the carbon will inhibit growth of any cracks generating in the magnetic base body 100 due to application of stress. The result is improved mechanical strength of the magnetic base body 100. Additionally, because the bonding parts 11 that bond the multiple metal magnetic grains 10 are constituted by an amorphous mixture containing carbon and an oxide of at least one element selected from Si, Al, Cr, Mg, Ti, and Zr, and because an oxide of any of these elements has high electrical resistivity, insulation reliability is ensured.

When the total quantity by mol of Si, Al, Cr, Mg, Ti, and Zr contained in the bonding part 11 is 1, preferably the quantity by mol of carbon in the bonding part 11 is 5 or lower (i.e., a ratio by mol of 5 or lower). While a higher ratio of carbon in the bonding parts 11 may cause electrical conduction paths to form due to carbon and thus lower the insulating property of the magnetic base body 100, adjusting the ratio of the quantity by mol of carbon to 5 or lower, relative to the total quantity by mol of Si, Al, Cr, Mg, Ti, and Zr representing 1, inhibits the insulating property of the magnetic base body 100 from dropping.

When the total quantity by mol of Si, Al, Cr, Mg, Ti, and Zr contained in the bonding parts 11 is 1, preferably the quantity by mol of carbon in the bonding part 11 is 0.4 or higher (i.e., a ratio by mol of 0.4 or higher). While a lower ratio of carbon in the bonding part 11 may decrease its effect of improving the mechanical strength of the magnetic base body 100, adjusting the ratio of the quantity by mol of carbon to 0.4 or higher, relative to the total quantity by mol of Si, Al, Cr, Mg, Ti, and Zr representing 1, allows for favorable improvement in the mechanical strength of the magnetic base body 100.

Second Embodiment

Figure 2:
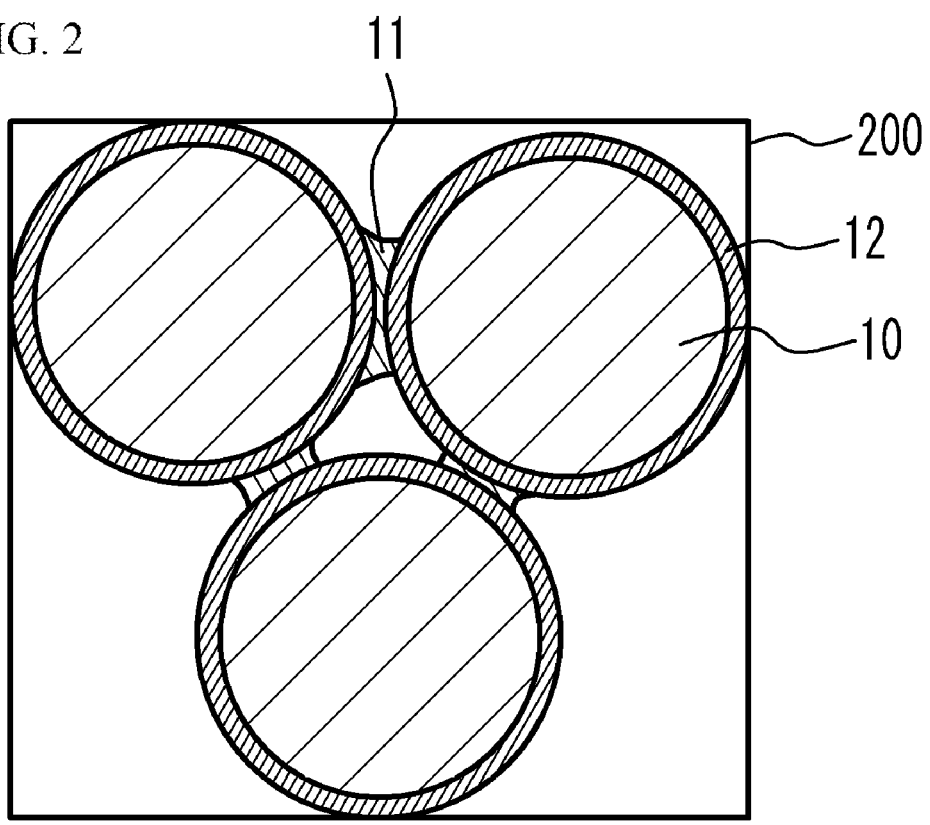
FIG. 2 is a cross-sectional view showing the magnetic base body pertaining to the second embodiment of the invention under the present application for patent.

FIG. 2 is a cross-sectional view showing the magnetic base body pertaining to the second embodiment of the invention under the present application for patent. In FIG. 2, a part of the magnetic base body 200 pertaining to the second embodiment is enlarged for illustration. With reference to FIG. 2, oxide films 12, which are insulating films, are provided on metal magnetic grains 10 in a manner covering their surface at least partially. The metal magnetic grains 10 may be the same as in the first embodiment. For example, they may be soft magnetic grains whose primary component is iron, or alloy grains, or pure iron grains. Bonding parts 11, constituted by an amorphous mixture containing carbon and an oxide of at least one element selected from Si, Al, Cr, Mg, Ti, and Zr, are provided in a manner contacting the oxide films 12 on the surface of multiple metal magnetic grains 10, and these multiple metal magnetic grains 10 are bonded as a result of the oxide films 12 bonding together via the bonding parts 11. The oxide films 12 may contain an oxide of at least one element selected from Si, Al, Cr, Mg, Ti, and Zr, for example, or they may contain an oxide of any element constituting the metal magnetic grains 10. The oxide films 12 contain hardly any resinate-derived carbon, which means that substantially no carbon is contained in the films, except for carbon that may be contained unintentionally, and the percentage of carbon is 1 percent by weight or lower, for example. The oxide films 12 and the bonding part 11 are clearly distinguishable based on the percentage of contained carbon. It should be noted that the parts of the oxide film 12 surface not contacting any bonding part 11 may have films which are formed separately from the oxide films 12 and in which resinate-derived carbon is present. These films containing resinate-derived carbon have no role in bonding, but their composition is the same as that of the bonding parts 11. The oxide films 12, and the films with resinate-derived carbon on the surface of the oxide films 12, are clearly distinguishable based on the percentage of contained carbon. The oxide films 12 may be amorphous or crystalline or a combination of both. Presence of the oxide films 12 can be recognized as differences in contrast (brightness) in an image of a cross-section of the magnetic base body 200 captured with a scanning electron microscope at a magnification of 5000 or so, for example. The composition of the oxide films 12 can be confirmed by capturing a cross-section of the magnetic base body 200 with a scanning electron microscope at a magnification of 3000 to 20000 or so, for example, and then applying the ZAF method based on energy dispersive X-ray spectroscopy to the results. The remaining constitutions are the same as in the first embodiment and therefore not explained.

[Manufacturing Method]

An example of how the magnetic base body pertaining to the second embodiment is manufactured, is explained. First, metal magnetic grains identical to those in the first embodiment are prepared and oxide films are formed on their surface. Oxide films may be formed on the surface of metal magnetic grains according to the sol-gel method or other wet method, or they may be formed on the surface of metal magnetic grains by heat-treating the metal magnetic grains. As an example, a treatment liquid containing TEOS (tetraethoxysilane), ethanol, and water may be mixed into a liquid containing metal magnetic grains, ethanol, and ammonia water to prepare a liquid mixture, followed by agitation and then filtration of the liquid mixture, to form metal magnetic grains having silicon oxide films formed on their surface. Also, the metal magnetic grains on which silicon oxide films have been formed may be heat-treated. The heat treatment may be performed for 20 to 60 minutes at 400 to 800° C. in a reducing ambience. It should be noted that methods other than those mentioned above, such as the CVD method, PVD method, ALD method, etc., may also be used to form oxide films on the surface of metal magnetic grains. Thereafter, the same method explained in the first embodiment is used to mix the metal magnetic grains having oxide films formed on their surface, with a resin composition and a solvent, to prepare a magnetic body paste. The subsequent steps are the same as in the first embodiment and therefore not explained.

According to the second embodiment, the surface of the metal magnetic grains 10 is covered at least partially with the oxide films 12 that contain substantially no carbon. The bonding parts 11, constituted by an amorphous mixture containing carbon and an oxide of at least one element selected from Si, Al, Cr, Mg, Ti, and Zr, enable bonding of multiple metal magnetic grains 10 by allowing the oxide films 12 to bond together via the bonding parts 11. Because the bonding part 11 constituted by the amorphous mixture contain carbon, the carbon will inhibit growth of any cracks generating in the magnetic base body 200 due to application of stress. The result is improved mechanical strength of the magnetic base body 200. Bonding of the multiple metal magnetic grains 10, caused by bonding together of the oxide films 12 via the bonding parts 11, results in good wettability on the bonding part 11 and oxide films 12, which in turn improves the joining strength between the multiple metal magnetic grains 10. This leads to further improvement in the mechanical strength of the magnetic base body 200.

Additionally, because the bonding part 11 that bond the multiple metal magnetic grains 10 are constituted by an amorphous mixture containing carbon and an oxide of at least one element selected from Si, Al, Cr, Mg, Ti, and Zr, and because an oxide of any of these elements has high electrical resistivity, insulation reliability is ensured. Moreover, because the surface of the metal magnetic grains 10 is covered with the oxide films 12, the insulating property of the magnetic base body 200 improves further. From the viewpoint of improving the insulating property of the magnetic base body 200, preferably the oxide films 12 contain an oxide of at least one element selected from Si, Al, Cr, Mg, Ti, and Zr. This is because an oxide of any of these elements has high electrical resistivity.

In the first embodiment and second embodiment, a magnetic base body was formed by stacking and pressure-bonding multiple magnetic layers and then heat-treating the pressure-bonded magnetic layers; however, it may be formed by other methods. For example, a magnetic base body may be formed by filling a die cavity with a magnetic body paste prepared by mixing multiple metal magnetic grains with a resin composition and a solvent to form a compact, and then heat-treating this compact.

Third Embodiment

Figure 3:
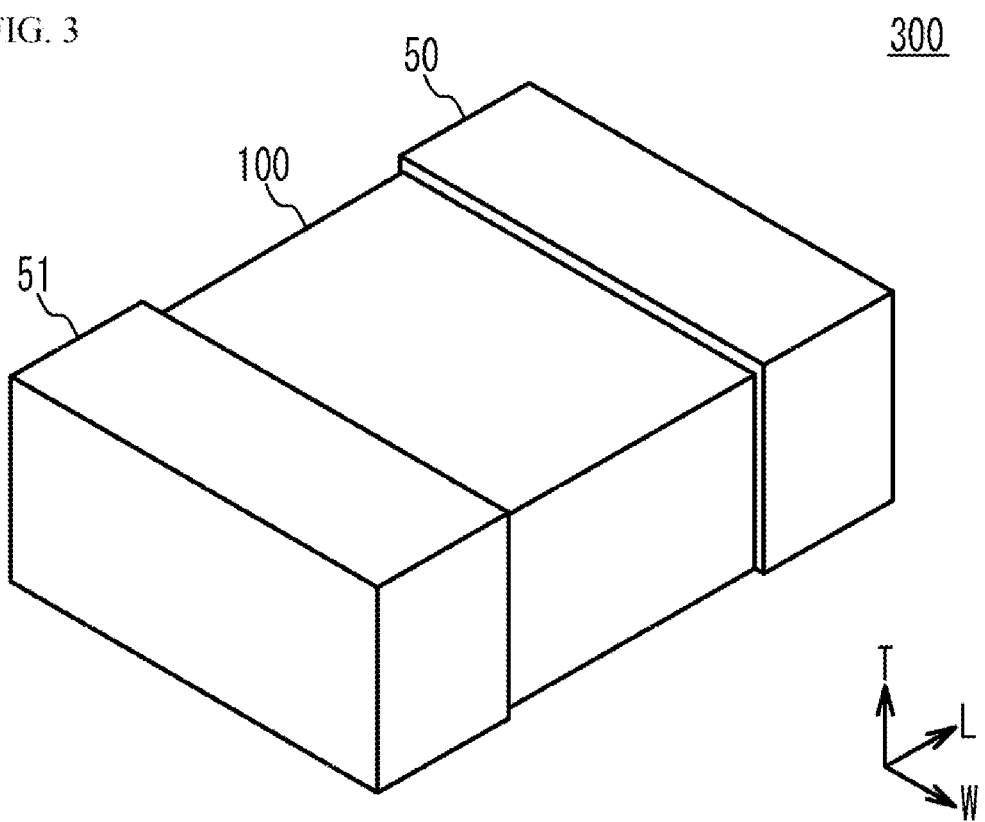
FIG. 3 is a perspective view showing the coil component pertaining to the third embodiment of the invention under the present application for patent.
Figure 4:
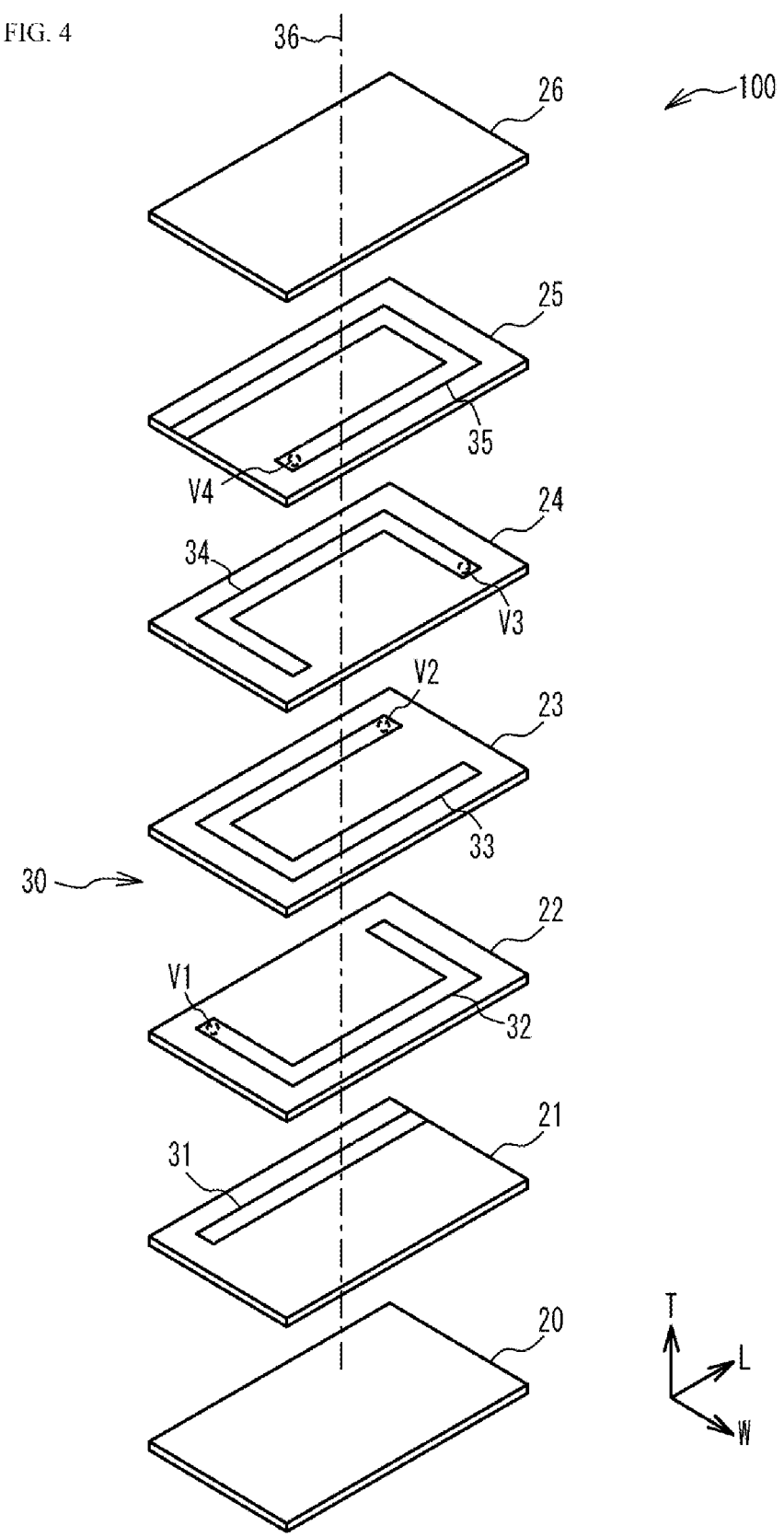
FIG. 4 is an exploded perspective view showing the coil component pertaining to the third embodiment of the invention under the present application for patent.

FIG. 3 is a perspective view showing the coil component pertaining to the third embodiment of the invention under the present application for patent. FIG. 4 is an exploded perspective view showing the coil component pertaining to the third embodiment of the invention under the present application for patent. In FIG. 4, external electrodes are not shown for convenience of illustration. Shown in FIGS. 3 and 4 is an example where the coil component is a multilayer inductor used as a passive element in various circuits.

With reference to FIGS. 3 and 4, the coil component 300 has external electrodes 50, 51 provided on the surface of the magnetic base body 100. The magnetic base body 100 is formed in roughly a rectangular solid shape. The "length" direction, "width" direction and "thickness" direction of the coil component 300 are illustrated as the "L" direction, "W" direction and "T" direction, respectively, in FIGS. 3 and 4. The coil component 300 has a length dimension (dimension in the L-axis direction) of 0.2 to 6.0 mm, a width dimension (dimension in the W-axis direction) of 0.1 to 4.5 mm, and a thickness dimension (dimension in the T-axis direction) of 0.1 to 4.0 mm, for example.

The magnetic base body 100 is a laminate constituted by a stack of cover layers 20, 26 and magnetic layers 21 to 25. To be specific, the magnetic base body 100 comprises a bottom cover layer 20, a first magnetic layer 21, a second magnetic layer 22, a third magnetic layer 23, a fourth magnetic layer 24, a fifth magnetic layer 25, and a top cover layer 26, which are stacked in this order from bottom to top in FIG. 4. The magnetic layers 21 to 25 have conductor patterns 31 to 35 formed on them. The conductor patterns 31 to 35 are embedded in the magnetic layers 21 to 25, while their top faces are roughly flush with the top faces of the magnetic layers 21 to 25. The cover layers 20, 26 may each be formed by a stack of multiple layers.

The conductor patterns 31 to 35 formed on the magnetic layers 21 to 25 are electrically connected, between the conductor patterns formed in the adjacent magnetic layers, respectively, through vias V1 to V4 included in the conductor patterns 32 to 35. A coil conductor 30 is formed as a result of the conductor patterns 31 to 35 connecting electrically. The coil conductor 30 has a coil axis 36. The coil conductor 30 is formed by the conductor patterns 31 to 35 wound around the coil axis 36, and built into the magnetic base body 100. The coil axis 36 extends in the T-axis direction. The cover layers 20, 26 and magnetic layers 21 to 25 are stacked in the T-axis direction. Accordingly, the direction of the coil axis 36 roughly corresponds with the stacking direction of the cover layers 20, 26 and magnetic layers 21 to 25. One end of the conductor pattern 31 is electrically connected to the external electrode 50, while one end of the conductor pattern 35 is electrically connected to the external electrode 51. The conductor patterns 31 to 35, as formed, contain a metal of high conductivity, and they may be formed from silver (Ag), palladium (Pd), copper (Cu), aluminum (Al), or an alloy thereof, for example.

[Manufacturing Method]

An example of how the coil component pertaining to the third embodiment is manufactured, is explained. First, following the same method explained in the first embodiment, a magnetic body paste prepared by mixing multiple metal magnetic grains with a resin composition and a solvent is applied on films (support films) and then dried to form magnetic films. If necessary, through holes are formed at the prescribed positions on the magnetic film using a laser, for example. A silver paste, copper paste, or other conductor paste is applied on the magnetic films by means of screen printing or the like, for example, and then dried with a hot-air dryer or other dryer to form precursors to conductor patterns. The aforementioned magnetic body paste is applied on the magnetic films by means of screen printing or other printing method, for example, and then dried with a dryer to form magnetic films around conductor patterns. Thereafter, the films (support films) are peeled and removed. This way, magnetic layers on which conductor patterns have been provided are formed.

The aforementioned magnetic body paste is applied on films (support films) according to the doctor blade method or the like, for example, and then dried with a dryer to form magnetic films, after which the films (support films) are peeled and removed. This way, cover layers are formed.

The magnetic layers and cover layers are stacked in the prescribed order and then pressure-bonded. The pressure-bonded magnetic layers and cover layers are cut to individual chips, which are then put through the heat treatment explained in the first embodiment. This heat treatment forms bonding part 11 on the surface of metal magnetic grains 10, allowing multiple metal magnetic grains 10 to bond via the bonding parts 11. This way, a magnetic base body 100 constituted by a stack of the magnetic layers 21 to 25 and cover layers 20, 26, and having a built-in coil conductor 30 formed by the conductor patterns 31 to 35, is formed. Thereafter, external electrodes 50, 51 are formed on the surface of the magnetic base body 100 by, for example, paste printing, plating, sputtering, or other method used in the thin film process.

According to the third embodiment, the coil component 300 comprises a magnetic base body 100. The magnetic base body 100, as explained in the first embodiment, comprises multiple metal magnetic grains 10 bonded by bonding part 11 that are constituted by an amorphous mixture containing carbon and an oxide of at least one element selected from Si, Al, Cr, Mg, Ti, and Zr. This improves the mechanical strength of the magnetic base body 100 and ensures its insulation reliability. Therefore, according to the third embodiment, the coil component 300 comprising the magnetic base body 100 whose insulation reliability is ensured and mechanical strength has been improved, can be obtained.

Fourth Embodiment

Figure 5:
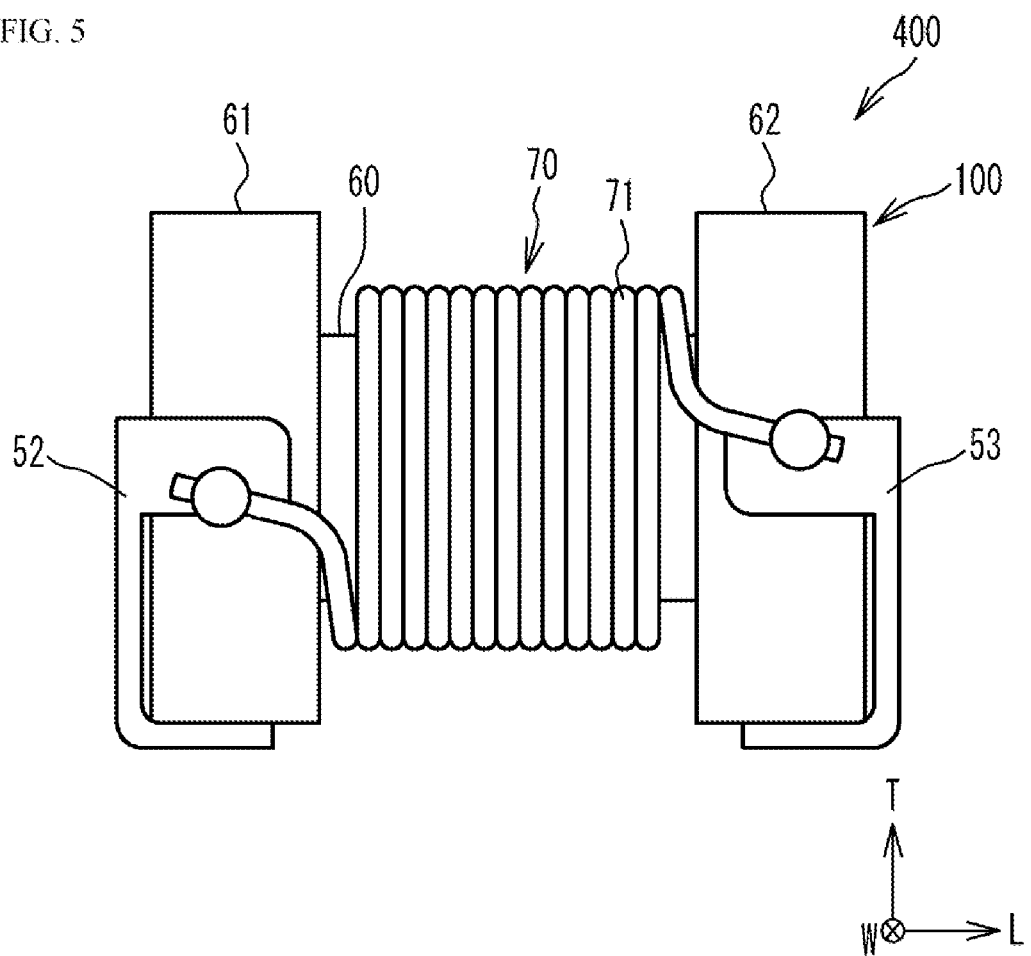
FIG. 5 is a side view showing the coil component pertaining to the fourth embodiment of the invention under the present application for patent.

FIG. 5 is a side view showing the coil component pertaining to the fourth embodiment of the invention under the present application for patent. With reference to FIG. 5, the coil component 400 comprises a magnetic base body 100, a coil winding part 70, and external electrodes 52, 53. The shape of the magnetic base body 100 is not limited in any way and may be that of a drum core, T-core, I-core, or the like. An example where the shape of the magnetic base body 100 is that of a drum core is illustrated. The magnetic base body 100 comprises a winding core part 60, a flange part 61 provided at one end part of the winding core part 60 in the axial direction, and a flange part 62 provided at the other end part of the winding core part 60. It should be noted that the flange part 61, or flange part 62, or both, may be absent depending on the shape of the magnetic base body 100. The winding core part 60 has a cross-section shape corresponding to a roughly rectangular shape, for example, but it may be a hexagonal, octagonal or other polygonal shape, or circular or elliptical shape, and the like. The "length" direction, "width" direction and "thickness" direction of the coil component 400 are illustrated as the "L" direction, "W" direction and "T" direction, respectively, in FIG. 5. The coil component 400 has a length dimension (dimension in the L-axis direction) of 3.2 mm, a width dimension (dimension in the W-axis direction) of 2.5 mm, and a thickness dimension (dimension in the T-axis direction) of 2.5 mm, for example.

The coil winding part 70 is formed by a coated conductive wire 71 being wound around the winding core part 60. The external electrode 52 is made of a metal plate and provided on the flange part 61. The external electrode 53 is made of a metal plate and provided on the flange part 62. The external electrodes 52, 53 may not be shaped like a plate so long as they are made of a conductive metal, and they may also be provided in locations other than on the flange parts 61, 62. One end of the coated conductive wire 71 is electrically connected to the external electrode 52, while the other end is electrically connected to the external electrode 53. The coated conductive wire 71 has a structure where the peripheral surface of a core wire made of copper is coated with an insulating film made of polyamide imide, for example. The core wire may be formed by a metal other than copper and, for example, it may be formed by silver, palladium, or a silver-palladium alloy. The insulating film may be formed by an insulating material other than polyamide imide and, for example, it may be formed by polyester imide, polyurethane, or other resin material.

[Manufacturing Method]

An example of how the coil component pertaining to the fourth embodiment is manufactured, is explained. First, following the same method explained in the first embodiment, a magnetic body paste is prepared by mixing multiple metal magnetic grains with a resin composition and a solvent. The magnetic body paste is filled in a die cavity and then pressed to form a drum-shaped compact. If necessary, this compact may be deburred. To this compact, the heat treatment explained in the first embodiment is applied. This heat treatment forms bonding part 11 on the surface of metal magnetic grains 10, and consequently a magnetic base body 100 is formed as a drum core in which the multiple metal magnetic grains 10 are bonded via the bonding parts 11. Thereafter, a coated conductive wire 71 is wound around the magnetic base body 100 to form a coil winding part 70, and the coating is stripped from both end parts of the coated conductive wire 71. Thereafter, external electrodes 52, 53 to be connected to the coated conductive wire 71 are formed on the magnetic base body 100 by, for example, paste printing, plating, sputtering or other method used in the thin film process.

According to the fourth embodiment, the coil component 400 comprises a magnetic base body 100. The magnetic base body 100, as explained in the first embodiment, comprises multiple metal magnetic grains 10 bonded by bonding part 11 that are constituted by an amorphous mixture containing carbon and an oxide of at least one element selected from Si, Al, Cr, Mg, Ti, and Zr. This improves the mechanical strength of the magnetic base body 100 and ensures its insulation reliability. Therefore, according to the fourth embodiment, the coil component 400 comprising the magnetic base body 100 whose insulation reliability is ensured and mechanical strength has been improved, can be obtained.

While an example of using the magnetic base body 100 pertaining to the first embodiment was illustrated in the third embodiment and fourth embodiment, the magnetic base body 200 pertaining to the second embodiment may be used instead.

Fifth Embodiment

Figure 6:
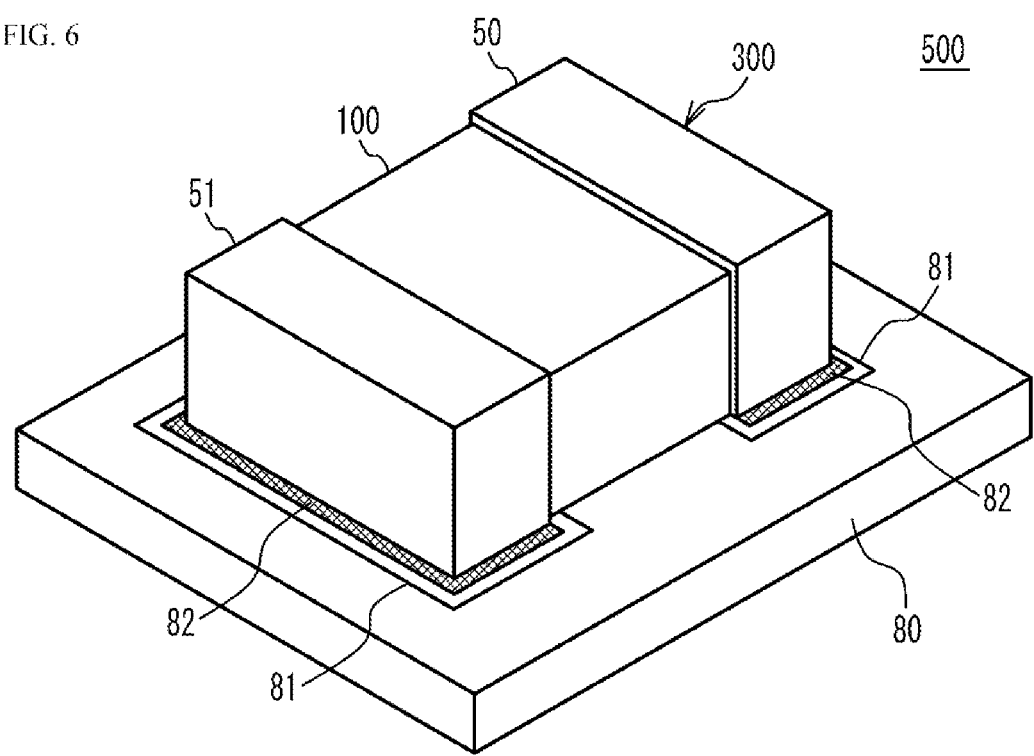
FIG. 6 is a perspective view showing the electronic device pertaining to the fifth embodiment of the invention under the present application for patent.

FIG. 6 is a perspective view showing the electronic device pertaining to the fifth embodiment of the invention under the present application for patent. In FIG. 6, solder 82 is hatched for clarity of illustration. With reference to FIG. 6, the electronic device 500 comprises a circuit board 80 and the coil component 300 in the third embodiment mounted on the circuit board 80. The coil component 300 is mounted on the circuit board 80 as a result of its external electrodes 50, 51 joined by solder 82 to electrodes 81 on the circuit board 80. This way, the electronic device 500 comprising the coil component 300 whose reliability has been improved, can be obtained.

While an example of mounting the coil component 300 pertaining to the third embodiment on a circuit board 80 was illustrated in the fifth embodiment, the coil component 400 pertaining to the fourth embodiment may be mounted on a circuit board 80 instead.

EXAMPLES

The invention under the present application for patent is explained more specifically below using examples and a comparative example; it should be noted, however, that the invention under the present application for patent is not limited to the modes described in these examples.

Example 1

The magnetic base body in Example 1 was produced according to the following method. Metal magnetic grains with composition ratios of 3.5 percent by weight of silicon, 2.5 percent by weight of chromium and 94 percent by weight of iron, and an average grain size of 5 μm, were used as material grains and these metal magnetic grains were mixed with a resin composition and a solvent to prepare a magnetic body paste. The resin composition was constituted to contain polyvinyl butyral (PVB) resin as a binder resin, and dimethoxy diphenyl silane as a resinate. For the solvent, toluene was used. The resinate was added to account for 0.6 percent by weight in terms of weight of $SiO_2$ relative to the weight of metal magnetic grains. This magnetic body paste was applied on a PET film and then dried at 80° C. to form a magnetic film on the PET film. Thereafter, the PET film was peeled and removed to form a magnetic layer with a thickness of 60 to 70 μm.

Multiple such magnetic layers were stacked and then pressure-bonded under a hydrostatic pressure of 6 tons/cm$^2$, to produce a laminate of approx. 0.5 mm in thickness. Next, a disk sample with an outer diameter of 8 mm, a toroidal sample with an outer diameter of 10 mm and inner diameter of 5 mm, and a strip sample of 4 mm×10 mm, were stamped out from this laminate, and the produced samples were heat-treated for 1 hour at 700° C. in an ambience that had been prepared by adding oxygen to nitrogen to adjust the oxygen concentration to 10000 ppm. This way, a disk-shaped magnetic base body, a toroidal-shaped magnetic base body, and a strip-shaped magnetic base body, were obtained.

Example 2

Magnetic base bodies of the respective shapes were obtained according to the same method in Example 1, except that the disk sample, toroidal sample, and strip sample were heat-treated for 1 hour at 700° C. in an ambience that had been prepared by adding oxygen to nitrogen to adjust the oxygen concentration to 9000 ppm.

Example 3

Magnetic base bodies of the respective shapes were obtained according to the same method in Example 1, except that the disk sample, toroidal sample, and strip sample were heat-treated for 1 hour at 700° C. in an ambience that had been prepared by adding oxygen to nitrogen to adjust the oxygen concentration to 8000 ppm.

Example 4

Magnetic base bodies of the respective shapes were obtained according to the same method in Example 1, except that the disk sample, toroidal sample, and strip sample were heat-treated for 1 hour at 700° C. in an ambience that had been prepared by adding oxygen to nitrogen to adjust the oxygen concentration to 5000 ppm.

Example 5

Magnetic base bodies of the respective shapes were obtained according to the same method in Example 1, except that the disk sample, toroidal sample, and strip sample were heat-treated for 1 hour at 700° C. in an ambience that had been prepared by adding oxygen to nitrogen to adjust the oxygen concentration to 2000 ppm.

Example 6

Magnetic base bodies of the respective shapes were obtained according to the same method in Example 1, except that the disk sample, toroidal sample, and strip sample were heat-treated for 1 hour at 700° C. in an ambience that had been prepared by adding oxygen to nitrogen to adjust the oxygen concentration to 1000 ppm.

Example 7

Magnetic base bodies of the respective shapes were obtained according to the same method in Example 1, except that the disk sample, toroidal sample, and strip sample were heat-treated for 1 hour at 700° C. in an ambience that had been prepared by adding oxygen to nitrogen to adjust the oxygen concentration to 2 ppm.

Example 8

Magnetic base bodies of the respective shapes were obtained according to the same method in Example 1, except that a magnetic body paste was prepared by using metal magnetic grains having silicon oxide films of 20 nm in thickness formed on their surface. The silicon oxide films were formed according to the sol-gel method.

Example 9

Magnetic base bodies of the respective shapes were obtained according to the same method in Example 1, except that a magnetic body paste was prepared by using metal magnetic grains having silicon oxide films of 20 nm in thickness formed on their surface, and that the disk sample, toroidal sample, and strip sample were heat-treated for 1 hour at 700° C. in an ambience that had been prepared by adding oxygen to nitrogen to adjust the oxygen concentration to 9000 ppm.

Example 10

Magnetic base bodies of the respective shapes were obtained according to the same method in Example 1, except that a magnetic body paste was prepared by using metal magnetic grains having silicon oxide films of 20 nm in thickness formed on their surface, and that the disk sample, toroidal sample, and strip sample were heat-treated for 1 hour at 700° C. in an ambience that had been prepared by adding oxygen to nitrogen to adjust the oxygen concentration to 8000 ppm.

Example 11

Magnetic base bodies of the respective shapes were obtained according to the same method in Example 1, except that a magnetic body paste was prepared by using metal magnetic grains having silicon oxide films of 20 nm in thickness formed on their surface, and that the disk sample, toroidal sample, and strip sample were heat-treated for 1 hour at 700° C. in an ambience that had been prepared by adding oxygen to nitrogen to adjust the oxygen concentration to 5000 ppm.

Example 12

Magnetic base bodies of the respective shapes were obtained according to the same method in Example 1, except that a magnetic body paste was prepared by using metal magnetic grains having silicon oxide films of 20 nm in thickness formed on their surface, and that the disk sample, toroidal sample, and strip sample were heat-treated for 1 hour at 700° C. in an ambience that had been prepared by adding oxygen to nitrogen to adjust the oxygen concentration to 2000 ppm.

Example 13

Magnetic base bodies of the respective shapes were obtained according to the same method in Example 1, except that a magnetic body paste was prepared by using metal magnetic grains having silicon oxide films of 20 nm in thickness formed on their surface, and that the disk sample, toroidal sample, and strip sample were heat-treated for 1 hour at 700° C. in an ambience that had been prepared by adding oxygen to nitrogen to adjust the oxygen concentration to 1000 ppm.

Example 14

Magnetic base bodies of the respective shapes were obtained according to the same method in Example 1, except that a magnetic body paste was prepared by using metal magnetic grains having silicon oxide films of 20 nm in thickness formed on their surface, and that the disk sample, toroidal sample, and strip sample were heat-treated for 1 hour at 700° C. in an ambience that had been prepared by adding oxygen to nitrogen to adjust the oxygen concentration to 3 ppm.

COMPARATIVE EXAMPLE

In the Comparative Example, a magnetic body paste was prepared as a mixture of metal magnetic grains having silicon oxide films of 20 nm in thickness formed on their surface, polyvinyl butyral (PVB) resin (binder resin), and toluene (solvent). In other words, the magnetic body paste was prepared without using resinate in the Comparative Example. Also, the disk sample, toroidal sample, and strip sample were heat-treated for 1 hour at 700° C. in an ambience that had been prepared by adding oxygen to nitrogen to adjust the oxygen concentration to 5000 ppm.

Except for these points, magnetic base bodies of the respective shapes were obtained according to the same method in Example 1.

The magnetic base bodies in Examples 1 to 14 and in the Comparative Example were evaluated for volume resistivity, bending strength, specific magnetic permeability, and ratio by mol.

[Volume Resistivity]

A silver paste was applied on the top face and bottom face of the disk-shaped magnetic base body and then dried, to form electrodes. The volume resistivity was calculated from the electrical resistance measured using these electrodes as well as from the actually measured volume.

[Bending Strength]

The bending strength was calculated from a three-point bending strength test performed on the strip-shaped magnetic base body.

[Specific Magnetic Permeability]

The specific magnetic permeability was calculated by measuring the magnetic permeability of the toroidal-shaped magnetic base body using the RF impedance/material analyzer E4991A manufactured by Keysight Technologies, Inc.

[Ratio by Mol]

The disk-shaped magnetic base body was cut along its thickness direction to expose a cross-section and this cross-section was captured with a scanning electron microscope (SEM), after which the composition of the bonding parts that are bonding the metal magnetic grains was analyzed according to the ZAF method based on energy dispersive X-ray spectroscopy (EDS). Then, the ratio of the quantity by mol of carbon (C) contained in the bonding parts, to the quantity by mol of silicon (Si) contained in the bonding parts, was calculated as the ratio by mol.

The obtained results are shown in Table 1.

constituted by an amorphous mixture containing an oxide of silicon, and carbon, thereby allowing the carbon in the bonding parts 11 to inhibit growth of cracks in the magnetic base body even when stress is applied, and its bending strength increased as a result. Also, Examples 1 to 14 resulted in inhibition of significant drop in volume resistivity. This is likely because their bonding part 11 that are bonding the multiple metal magnetic grains 10 contain an oxide of Si having high electrical resistivity. Besides an oxide of Si, oxides of Al, Cr, Mg, Ti, and Zr also have high electrical resistivity, which means that, when the bonding part 11 are constituted by an amorphous mixture containing an oxide of any of these elements and carbon, an effect of inhibiting a drop in volume resistivity is likely achieved. The foregoing confirms that, by bonding the multiple metal magnetic grains 10 via the bonding part 11 constituted by an amorphous mixture containing carbon and an oxide of at least one element selected from Si, Al, Cr, Mg, Ti, and Zr, mechanical strength can be improved while still ensuring insulation reliability.

Also, as shown by the results of Examples 7 and 14, volume resistivity dropped significantly when the ratio of the quantity by mol of carbon (C) contained in the bonding part 11 to the total quantity by mol of Si, Al, Cr, Mg, Ti, and Zr contained in the bonding part 11 (considering this mol to be 1), was higher than 5, compared to when the ratio by mol of carbon contained in the bonding part 11 using the same reference was 5 or lower. This is likely because a higher ratio of carbon in the bonding part 11 makes it easier for electrical conduction paths to form due to carbon. The foregoing confirms that, by adjusting the ratio by mol of carbon (C) in the bonding part 11 to 5 or lower, relative to the total quantity by mol of Si, Al, Cr, Mg, Ti, and Zr contained in the bonding part 11 (considering this mol to be 1), insulation

TABLE 1

| | Composition [wt %] | | | Additive quantity of $SiO_2$ [wt %] | Oxide film | Heat treatment temperature [° C.] | Oxygen concentration for heat treatment [ppm] | Ratio by mol | Bending strength [MPa] | Volume resistivity [Ω · cm] | Specific magnetic permeability |
|---|---|---|---|---|---|---|---|---|---|---|---|
| | Sr | Cr | Fe | | | | | | | | |
| Example 1 | 3.5 | 2.5 | 94 | 0.6 | No | 700 | 10000 | 0.42 | 70 | $4.1 \times 10^9$ | 29 |
| Example 2 | 3.5 | 2.5 | 94 | 0.6 | No | 700 | 9000 | 0.51 | 72 | $2.8 \times 10^9$ | 30 |
| Example 3 | 3.5 | 2.5 | 94 | 0.6 | No | 700 | 8000 | 1.3 | 74 | $8.0 \times 10^8$ | 31 |
| Example 4 | 3.5 | 2.5 | 94 | 0.6 | No | 700 | 5000 | 3.0 | 78 | $5.0 \times 10^8$ | 31 |
| Example 5 | 3.5 | 2.5 | 94 | 0.6 | No | 700 | 2000 | 4.4 | 81 | $2.0 \times 10^8$ | 29 |
| Example 6 | 3.5 | 2.5 | 94 | 0.6 | No | 700 | 1000 | 4.8 | 87 | $1.1 \times 10^8$ | 30 |
| Example 7 | 3.5 | 2.5 | 94 | 0.6 | No | 700 | 2 | 5.4 | 90 | $1.0 \times 10^5$ | 33 |
| Example 8 | 3.5 | 2.5 | 94 | 0.6 | Yes | 700 | 10000 | 0.44 | 78 | $2.0 \times 10^{10}$ | 27 |
| Example 9 | 3.5 | 2.5 | 94 | 0.6 | Yes | 700 | 9000 | 0.52 | 79 | $1.5 \times 10^{10}$ | 29 |
| Example 10 | 3.5 | 2.5 | 94 | 0.6 | Yes | 700 | 8000 | 1.4 | 86 | $7.0 \times 10^9$ | 27 |
| Example 11 | 3.5 | 2.5 | 94 | 0.6 | Yes | 700 | 5000 | 2.9 | 92 | $6.4 \times 10^9$ | 28 |
| Example 12 | 3.5 | 2.5 | 94 | 0.6 | Yes | 700 | 2000 | 4.2 | 103 | $2.0 \times 10^9$ | 29 |
| Example 13 | 3.5 | 2.5 | 94 | 0.6 | Yes | 700 | 1000 | 4.9 | 112 | $5.0 \times 10^8$ | 29 |
| Example 14 | 3.5 | 2.5 | 94 | 0.6 | Yes | 700 | 3 | 5.3 | 120 | $3.0 \times 10^5$ | 32 |
| Comparative Example | 3.5 | 2.5 | 94 | 0 | Yes | 700 | 5000 | 0 | 5 | $8.2 \times 10^9$ | 32 |

As shown in Table 1, Examples 1 to 14 in which the magnetic base body was produced using a magnetic body paste prepared with a Si-containing resinate added, resulted in higher bending strength compared to the Comparative Example in which the magnetic base body was produced using a magnetic body paste prepared without any Si-containing resinate added. This is likely because, in Examples 1 to 14, the use of a magnetic body paste prepared with a Si-containing resinate added caused the multiple metal magnetic grains 10 to bond via the bonding parts 11 reliability can be improved. It is confirmed that, from the viewpoint of improving the insulation reliability, the ratio by mol is preferably 4.8 or lower, or more preferably 4.4 or lower, or yet more preferably 3.0 or lower.

Also, as shown by the results of Examples 1 to 14, bending strength increased when the ratio of the quantity by mol of carbon (C) contained in the bonding parts 11 to the total quantity by mol of Si, Al, Cr, Mg, Ti, and Zr contained in the bonding parts 11 (considering this mol to be 1), was 0.4 or higher. This confirms that, by adjusting the ratio by mol of carbon (C) in the bonding part 11 to 0.4 or higher, relative to the total quantity by mol of Si, Al, Cr, Mg, Ti, and Zr contained in the bonding part 11 (considering this mol to be 1), mechanical strength can be improved. It is confirmed that, from the viewpoint of improving mechanical strength, the ratio by mol is preferably 0.42 or higher, or more preferably 0.51 or higher, or yet more preferably 1.3 or higher.

It should be noted that, while the ratio by mol in Table 1 indicates the ratio of the quantity of carbon (C) by mol to the quantity of silicon (Si) by mol, it is likely that, because the comparison is based on quantity by mol, the same effect can be achieved when the ratio of the quantity of carbon (C) by mol to the total quantity by mol of Si, Al, Cr, Mg, Ti, and Zr satisfies the aforementioned requirement. Also, because the results in Table 1 reflect the fact that the bonding part 11 are constituted by carbon (C) and an oxide containing silicon (Si), it can be argued that preferably the amorphous mixture constituting the bonding part 11 contains an oxide of silicon as its primary component. By "contains an oxide of silicon as its primary component," it means the percentage of Si relative to the total quantity of Si, Al, Cr, Mg, Ti, and Zr contained in the bonding part 11 is 50 percent by weight or higher, where it is preferably 70 percent by weight or higher, or more preferably 80 percent by weight or higher, or yet more preferably 90 percent by weight or higher.

Also, Examples 8 to 14 in which oxide films 12 were formed on the surface of metal magnetic grains 10 and multiple metal magnetic grains 10 were bonded as a result of the oxide films 12 on the multiple metal magnetic grains 10 bonding together via the bonding parts 11, resulted in higher bending strength and volume resistivity compared to Examples 1 to 7 in which no oxide films 12 were formed on the surface of metal magnetic grains 10. It is likely that, because multiple metal magnetic grains 10 were bonded as a result of the oxide films 12 on the multiple metal magnetic grains 10 bonding together via the bonding parts 11, good wettability on the bonding part 11 and oxide films 12 was achieved and consequently joining strength between the metal magnetic grains 10 via the bonding part 11 improved, which in turn improved bending strength. Volume resistivity was likely higher because the surface of metal magnetic grains 10 was covered with oxide films 12. This confirms that, by covering the surface of metal magnetic grains 10 at least partially with oxide films 12 that contain substantially no carbon and by allowing multiple metal magnetic grains 10 to be bonded by bonding part 11 as a result of their oxide films 12 bonding together via the bonding parts 11, mechanical strength and insulation reliability can be improved.

In this disclosure, in some embodiments, the "bonding parts" bond the multiple metal magnetic grains to the extent that the parts alone can sustain the shape of the bonded structure in intended use of the magnetic base body ("bonding" refers to more than "contacting", "attaching", or the like). In some embodiments, the bonding parts bond substantially all of the multiple metal magnetic grains. In some embodiments, the amorphous mixture constituting the bonding parts has a structure wherein carbon is randomly distributed or penetrated in an amorphous structure formed by a metal oxide. In some embodiments, the bonding parts are formed by sintering and include substantially no binder component such as resin. In some embodiments, there is a void between the multiple metal magnetic grains bonded via the bonding parts. In some embodiments, the compositions/structure of the bonding parts can be determined based on a randomly selected piece thereof as an exemplary sample. In some embodiments, any one or more of the disclosed elements or components as options can be exclusively selected or can expressly be excluded, depending on the intended use, the target properties, etc., and/or for practical reasons, operational reasons, etc.

The foregoing described embodiments of the invention under the present application for patent in detail; it should be noted, however, that the invention under the present application for patent is not limited to these specific embodiments and that various changes and modifications can be applied to the extent that they do not deviate from the key points of the invention under the present application for patent as explicitly, implicitly, or inherently described herein.

What is claimed is:

1. A method for manufacturing a coil component, comprising steps of:
   providing multiple metal magnetic grains;
   preparing a magnetic body paste by mixing: the multiple metal magnetic grains; a binder resin containing a resinate having a chemical compound structure constituted by (i) carbon, (ii) oxygen, and (iii) at least one element selected from the group consisting of Si, Al, Cr, Mg, Ti, and Zr; and a solvent;
   forming a compact using the magnetic body paste;
   heat-treating the compact to form, on surfaces of the metal magnetic grains, bonding parts constituted by an amorphous oxide containing carbon and the at least one element selected from the group consisting of Si, Al, Cr, Mg, Ti, and Zr which constitutes the resinate, thereby forming a magnetic base body wherein the multiple metal magnetic grains are bonded via the bonding parts;
   forming a coil that includes a metal conductor; and
   forming external electrodes on surfaces of the magnetic base body and connecting end parts of the coil to the external electrodes, respectively.

2. The method for manufacturing a coil component according to claim 1, wherein, in preparing the magnetic body paste, the resinate is present, in the binder resin, in a form of a half-solid phase including a sol-gel state or a liquid phase.

3. The method for manufacturing a coil component according to claim 1, wherein, in forming the magnetic base body, the heat-treating step is conducted in a manner removing a resin component of the binder resin by thermal decomposition before the resinate is decomposed, and then decomposing the resinate and amorphizing a metal component constituting the at least one element selected from the group consisting of Si, Al, Cr, Mg, Ti, and Zr while incorporating therein carbon of the resinate, thereby forming the amorphous oxide.

4. The method for manufacturing a coil component according to claim 1, wherein, in forming the magnetic base body, the heat-treating step is performed at 500° C. or higher in an ambience having an oxygen concentration of 2 to 10000 ppm.

5. The method for manufacturing a coil component according to claim 1, wherein, in providing the multiple metal magnetic grains, the multiple metal magnetic grains are multiple metal magnetic grains having oxide films formed on their surfaces.

6. The method for manufacturing a coil component according to claim 5, wherein, in forming the magnetic base body, the multiple magnetic grains are bonded by the oxide films formed on their surfaces via the bonding parts.

7. The method for manufacturing a coil component according to claim 1, wherein, in forming the compact, multiple magnetic layers are each formed using the magnetic body paste, and then stacked, thereby forming the compact.

8. The method for manufacturing a coil component according to claim 7, wherein the step of forming the coil is conducted during the step of forming the compact, wherein when the multiple magnetic layers are each formed using the magnetic body paste, a pattern of the metal conductor is formed on each of the multiple magnetic layers except for magnetic layers for top and bottom portions of the compact, followed by stacking the multiple magnetic layers, thereby forming a coil-embedded compact as the compact.

9. The method for manufacturing a coil component according to claim 1, wherein, in forming the compact, the compact is formed by filling a die cavity with the magnetic body paste, followed by compression molding.

10. The method for manufacturing a coil component according to claim 9, wherein the step of forming the coil is conducted after the step of forming the magnetic base body but before the step of forming the external electrodes, wherein the coil is formed by winding the metal conductor around the magnetic base body.

11. The method for manufacturing a coil component according to claim 1, wherein the magnetic base body has a carbon-containing region, other than the bonding parts, where carbon is present.

12. The method for manufacturing a coil component according to claim 11, wherein the carbon-containing region other than the bonding parts is a region of triple-point parts each surrounded by immediately adjacent three or more metal magnetic grains among the multiple metal magnetic grains.

13. The method for manufacturing a coil component according to claim 1, wherein, in forming the external electrodes, the external electrodes are formed on the surfaces of the magnetic base body by paste printing, plating, or sputtering.

14. The method for manufacturing a coil component according to claim 1, wherein a ratio of a quantity by mol of carbon contained in the bonding parts to a total quantity by mol of silicon, aluminum, chromium, magnesium, titanium, and zirconium contained in the bonding parts is 5 or lower.

15. The method for manufacturing a coil component according to claim 1, wherein a ratio of a quantity by mol of carbon contained in the bonding parts to a total quantity by mol of silicon, aluminum, chromium, magnesium, titanium, and zirconium contained in the bonding parts is 0.4 or higher.

16. The method for manufacturing a coil component according to claim 1, wherein the amorphous oxide in the bonding parts contains an oxide of silicon as its primary component.

17. The method for manufacturing a coil component according to claim 1, wherein a primary component of the multiple metal magnetic grains is iron.

18. The method for manufacturing a coil component according to claim 1, wherein the resinate is dissolved in the binder resin and exists as a half-solid phase or liquid phase including sol-gel state, said resinate having at least one element selected from the group consisting of Si, Al, Cr, Mg, Ti, and Zr.

19. The method for manufacturing a coil component according to claim 1, wherein the resinate has a silsesquioxane having $(R\text{---}SiO_{1.5})_n$ structure (R: organic functional group), siloxane having Si—O—Si structure, or an alkoxide having M-OR structure (M: Si, Al, Cr, Mg, Ti, and/or Zr, R: organic functional group).

20. The method for manufacturing a coil component according to claim 1, wherein the amorphous oxide constituting the bonding parts contains an oxide of silicon as its primary component, and a ratio of a quantity by mol of carbon contained in the bonding parts to a quantity by mol of silicon contained in the bonding parts is 0.4 or higher and 5 or lower.

* * * * *